(12) United States Patent
Kasatani

(10) Patent No.: US 6,617,695 B1
(45) Date of Patent: Sep. 9, 2003

(54) SEMICONDUCTOR DEVICE AND SEMICONDUCTOR MODULE USING THE SAME

(75) Inventor: Yasushi Kasatani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/704,699

(22) Filed: Nov. 3, 2000

(30) Foreign Application Priority Data

May 30, 2000 (JP) ........................................ 2000-159503

(51) Int. Cl.⁷ ........................... H01L 29/40; H01L 23/34
(52) U.S. Cl. ........................ 257/778; 257/723; 257/686; 257/737; 257/738
(58) Field of Search ........................ 257/693, 737–738, 257/685, 686, 777, 778, 723, 731, 779

(56) References Cited

U.S. PATENT DOCUMENTS 5,744,862 A    4/1998   Ishii ........................... 257/693
5,770,480 A   *   6/1998   Ma et al.

FOREIGN PATENT DOCUMENTS

JP         9-121017       5/1997
JP       11-111914       4/1999

* cited by examiner

*Primary Examiner*—Wael Fahmy
*Assistant Examiner*—DiLinh Nguyen
(74) *Attorney, Agent, or Firm*—Leydig, Voit & Mayer, Ltd.

(57) ABSTRACT

Lands for mounting are located on the upper and lower surfaces of a substrate. External electrodes are exposed at a rear surface of a package body. An IC package is mounted by bonding the lands for mounting to the external electrodes. Lands for external connection are connected to the lands for mounting. The lands for external connection are located outside of the IC package. Solder bumps are connected to one side of the lands for external mounting. Thus, a semiconductor device for a semiconductor module is provided.

6 Claims, 11 Drawing Sheets

US 6,617,695 B1

SEMICONDUCTOR DEVICE AND SEMICONDUCTOR MODULE USING THE SAME

BACKGROUND OF THE INVENTION

The present invention relates to low-profile semiconductor devices which can be packaged with high density and a semiconductor module using them, and more particularly to a semiconductor device which can improve heat-cycle resistant characteristic and effectively prevent short-circuiting between solder bumps for packaging and a semiconductor module using them.

Previously known semiconductor modules include SIMMs (Single Memory Module) and DIMMs (Dual Inline Module). The SIMM is a storage module in which a plurality of plastic package ICs are mounted on a single surface of a glass-epoxy substrate, and each of the plastic packaged ICs has an external lead protruding from the side of an IC package body resin-sealed in an epoxy resin. The DIMM is a storage module in which a plurality of the same plastic packaged ICs are mounted on both surfaces of the glass epoxy substrate.

FIG. 13 is a plan view of a conventional semiconductor device, and FIG. 14 is a side view of FIG. 13. In FIGS. 13 and 14, reference numeral 1 denotes a substrate including substrates 1a, 1b, and 1c which are spaced apart from one another. Each substrate component has lands 3 for mounting an IC package 7 on both upper and lower surfaces. The substrate component has also lands 4 outside the lands 3. The lands 4 serve as terminals for external connection. The corresponding lands 3 and 4 are electrically connected to each other by wirings 5 on both surfaces of the substrate 1. The lands 4 for external connection on both surfaces of the substrate 1 are connected to each other by conductors embedded in through-holes.

A solder bump 6, located at the tip of the land 4 for making an external connection on the one surface of the substrate 1 (lower side in FIG. 14). The IC package 7 includes a package body 8 and straight leads 9 which protrude laterally from both right and left sides of the body 8. The straight leads 9 are electrically connected to the corresponding lands 3 for mounting and supported by the substrate 1. Reference numeral 2 denotes a gap between the substrate 1 (1a, 1b, 1c) and the package body 8. In this way, a semiconductor device 24 includes the substrate 1, lands 3 for mounting, lands 4 for external connection, wirings 5, solder bumps 6 and IC package 7.

The semiconductor device 24 can be manufactured as follows. First, with the IC package 7 positioned on the upper surface of the substrate 1, the straight leads 9 are soldered to the lands 3 for mounting by a re-flow technique. Next, the substrate 1 is turned upside down. Likewise, on the lower surface of the substrate 1, the straight leads 9 of another IC package 7 are soldered to the lands 3 for mounting, and the solder bumps 6 are soldered to the tips of the land 4 for external connection.

The structure of a semiconductor module will be explained. FIG. 15 is a side view of the structure of a conventional semiconductor module in which a plurality of semiconductor devices one of which is shown in FIGS. 13 and 14, are soldered on a mother board 20. As seen from FIG. 15, lands 21 for mounting the semiconductor device 24 are formed on the upper surface of the mother board 20. The solder bumps 6 are electrically connected to the semiconductor device 24, respectively. Likewise, the solder bumps 6 of another semiconductor device 24 are electrically connected to the lands 21 on the lower surface of the mother board 20. In this way, a semiconductor module 25 includes the mother board 20, upper and lower lands 21 and semiconductor devices 24.

The semiconductor module 25 can be manufactured as follows. First, a semiconductor device 24 is positioned on the upper side of the mother board 20. In this case, solder paste is previously supplied to contact positions between the solder bumps 6 and the lands 21. The solder paste and solder bumps 6 are melted and bonded to the lands 21 so that the semiconductor device 24 is secured to the mother board 24. Next, the mother board 20 is turned upside down. Likewise, another semiconductor device 24 positioned on the lower side of the mother board 20 is secured to the mother board 20. Thus, the semiconductor module 25 is completed.

The upper semiconductor device 24 which is first soldered and secured to the mother board 20 and is shown at the lower position in FIG. 15 is caused to "reflow" in its dangling state. Therefore, the solder bumps 6 are extended downward owing to the weight of the semiconductor device itself so that they are deformed in a "tsuzumi" (hand drum) shape with its diameter decreasing toward center. On the other hand, the upper semiconductor device 24 which is afterward, soldered and secured to the mother board 20 and is shown at the upper position in FIG. 15 is caused to reflow in a state placed on the mother board 20. Therefore, the solder bumps 6 are compressed owing to the weight of the semiconductor device itself so that they become deformed in a barrel shape with its diameter increasing toward center. FIG. 16 is a schematic side view of the solder bumps 6 thus deformed on the upper and lower surfaces of the semiconductor module 25. If the upper solder bumps are crushed as seen from FIG. 16 so that they are going to swell in diameter from the prescribed positions together with the paste, the solder bumps 6 may be short-circuited to each other at the time of reflow, provided that the bonding pitch between the adjacent solder bumps 6 is small.

The lower solder bump 6, as seen from FIG. 16, becomes deformed into the "tsuzumi" shape during its reflow so that the sectional area of the bonding portion is going to decrease. Therefore, when the completed semiconductor module 25 is subjected to the temperature cycle test in which a temperature change from −40° C. to 125° C. is made every thirty minutes, the soldered portion may be broken owing to a crack due to thermal fatigue. The breakage due to the thermal fatigue is likely to occur at the region where the maximum bending moment due to thermal deformation is applied to the bonding end of the solder bump, i.e. the bonding boundary between the land 4 for external connection having a small sectional area and the solder bump 6. However, the usable solder bump 6 must have a small diameter under the limitation of the pitch between the adjacent leads. Therefore, breakage may occur at the portion having a small secondary moment at the sectional area of the bonding boundary, i.e., having a small sectional area at the bonding boundary.

On the other hand, the semiconductor module 25 incorporates the mother boards 20 having different thermal expansion coefficients, substrates 1, IC packages 7 and circuit components (not shown).

Therefore, thermal deformation occur at the soldering portion owing to a temperature change during the operation or during the temperature cycle test. The quantity of the thermal deformation is proportional to the difference between the different thermal expansion coefficients, distance and temperature difference between the soldering portions. The largest thermal deformation occurs at the soldering portions of the lands 4 for external connection corresponding to the lands 3 for mounting at both ends which are secured by soldering and interpose the longest distance therebetween. The breakage may occur at the soldering portions of these both ends.

The holding strength with N solder bumps 6 aligned in a row on both sides of the IC package 7, when the IC package 7 is bonded to the substrate 1 can be represented as follows. In this case, the solder bump 6 is approximated as a cylinder having a diameter D. Assuming that the permissible stress of solder at the temperature of reflow, e.g., about 200° C. is σa and the permissible holding weight of the entire solder cylinder of the solder bump 6 is Wa, Wa=σa×π×D×D×2×N/4. From this equation, it can be seen that the permissible holding weight of the solder bump 6 can be increased by increasing the diameter D of the solder bump 6 and the number N of the solder bumps 6.

However, increasing the diameter of the solder bump 6 and the number of the solder bumps 6 presents the following problem. Namely, on the substrate 1, the lands 3 for mounting are aligned densely in a row with a pitch P1 in order to bond the straight leads 9 protruding from both sides of the IC package 7. Therefore, the lands 4 for external connection must be provided outside the lands 3 for mounting. This correspondingly increases the width of the substrate, thereby increasing the mounting area. In order to align the N soldering bumps 6 in a row at the pitch P1 on the substrate 1, the size of (N−1)×P1 is required in the aligned direction. It can be seen from this equation that in order to decrease the size of the substrate 1 and increase the number of the solder bumps 6, it is necessary to decrease the pitch P1.

Assuming that the distance between the solder bumps 6 is W, the diameter D=P1−W. In order to increase the diameter D of the solder bump 6, the pitch P1 between-the adjacent solder bumps 6 must be increased. This means that the pitch of the straight leads 9 (or wirings 5) must be increased. However, the conventional semiconductor device 24 cannot simultaneously satisfy the contradictory requirements of increasing the diameter of the solder bump 6 and increasing the number N of the solder bumps 6 to decrease its pitch. Thus, there is a limitation in mounting the IC package having multiple pins and narrow pitch.

In order to bond the straight leads 9 of the package body 8 to the substrate 1, the lands 3 for mounting must be provided in a row substantially parallel to the side of the package body 8. Therefore, the lands 4 for external connection cannot be provided on the areas where the lands 3 are provided. The lands 4 for external connection must be inevitably provided outside the lands 3 for mounting. This correspondingly increases the mounting area of the semiconductor device 24 and the semiconductor module 25 and hence cannot downsize them.

The thickness of the sealing resin for the package body 8 mounted on the substrate 1 so as to constitute the semiconductor device 24 is at most 1 mm, even in the most low-profile IC package 7. The thickness of the straight leads 9 for external extension is 0.125 mm. Therefore, the thickness (H in FIG. 14) of the sealing resin from the surface of the straight lead 9 to the outer surface of the package body 8 is H=((1−0.125)/2)+0.125=0.5625 mm. In order to bond the semiconductor device 24 to the mother board 20 with no hitch, assuming that the thickness of the solder paste for bonding the solder bumps is 65 μm, the requirement D+2×0.065 mm >0.5625 mm, i.e., the diameter of the solder bump 6>0.435 mm, must be satisfied. If not so, the package body 8 and the mother board 20 are brought into contact with each other so that the solder bump 6 cannot be bonded to the land 21 and hence the semiconductor module 25 cannot be constructed. Now if the solder bumps 6 each having the diameter D of 0.45 mm and distance of 0.35 mm between the adjacent bumps are used, the IC package 7 can be mounted with the lead pitch P1=0.45+0.35=0.8 mm.

Now, when it is intended that the IC package 7 be mounted with a smaller lead pitch (P1=0.65 mm, 0.5 mm and 0.4 mm) using the solder bumps 6 each having a diameter of 0.45 mm, in the case of the IC package 7 with P1=0.65 mm, the gap W between the adjacent solder bumps 6 is W=0.65−0.45=0.2 mm. In this case, after the soldering paste has been solder-printed on the substrate 1 and mother board 20, when the solder bumps 6 are bonded by its reflow, the molten solder paste flows into the small gap of W=0.2 mm between the solder bumps 6 so that the solder bumps may be short-circuited to each other. In this way, in the conventional technique, since the ball interval between the adjacent solder bumps 6 for external connection depends on the lead pitch of the straight leads 9 of the IC package 7. This presents the problem that the semiconductor module 25 including the IC packages 7 each having the standard of the smaller lead pitch P1=0.65 mm, 0.5 mm, 0.4 mm cannot be constructed.

Further, the lands 3 for mounting to be connected to the straight leads 9 of the semiconductor device 24 are aligned with equal pitches P1 in a row. The corresponding lands 4 for external connection are aligned with equal pitches in a row outside the lands 3 for mounting. Therefore, the region bonded by solder or solder bump 6 provided an equivalent thermal expansion coefficient and equivalent vertical elastic coefficient that are different from those between the straight leads 9 and substrate 1 and between the substrate and the mother board 20, and hence the thermal stress may be increased.

SUMMARY OF THE INVENTION

An object of the present invention is to provide a low-profile highly-productive semiconductor device that does not raise short-circuiting between adjacent solder bumps and provides high bonding strength of the solder bonding area in a configuration in which the solder bumps for external connection each has a larger diameter than the distance-from the lands for external connection of a substrate to the outer surface of an IC package having external electrodes with a small lead pitch mounted on the substrate.

Another object of the invention is to reduce the thermal stress of the region of bonding a solder bump.

Still another object of the invention is to improve the standardization of the diameter of the solder bump and its productivity.

A semiconductor device according to the invention comprises:

an IC package having a plurality of external electrodes exposed to the rear surface of a package body; and a substrate provided with lands for mounting to which the external electrodes are bonded, lands for external connection connected to solder bumps for external connection and formed outside an area where the IC package is mounted, and wirings for connecting the lands for mounting and the lands for external connection.

In the semiconductor device according to the invention, the lands for mounting, the lands for external connection and the wirings are formed on an upper surface and a lower surface of the substrate; the corresponding lands for external connection on both surfaces are electrically connected to each other and the solder bumps are connected to the lands for external connection on the one surface; and the external electrodes are connected to at least one of the lands for mounting on both surfaces of the substrate.

In the semiconductor device according to the invention, the IC package is a BOC package, and the substrate includes a through-hole for receiving potting resin, the potting resin sealing a wire bonding portion of the BOC package to protrude when the BOC package is mounted on the substrate.

In the semiconductor device according to the invention, the lands for external connection includes a first group of lands for external connection which are arranged with pitches twice as long as those of the wirings on both sides of the package body; and a second group of lands for external connection which are arranged with pitches twice as long as those of the wirings outside the first group of lands for external connection, the second group of lands for external connection being arranged in a displaced manner from the first group of lands for external connection in their column directions.

In the semiconductor device according to the invention, dummy lands for external connection which are not connected to the external electrodes of the IC package are formed outside the ends of columns of the first group of lands for external connection and second group of lands for external connection which are formed on the upper and lower surface of the substrate, and the solder bumps are bonded to the dummy lands for external connection which are formed on the same plane as that of the lands for external connection to which the solder bumps are bonded.

The semiconductor module comprises the semiconductor device defined in any one of the above invention; and a mother board of which on the upper and lower surfaces, lands are formed for mounting semiconductor device, and solder bumps are bonded to the lands.

In the semiconductor module according to the invention, the lands for external connection and the lands to which the solder bumps are bonded, respectively have equal diameters.

In the semiconductor module according to the invention, the solder bumps bonded to the first group of lands for external connection on the one side of a first semiconductor device are arranged on an upper surface of the mother board, and the solder bumps bonded to the second group of lands for external connection on the one side of a second semiconductor device are arranged on the lower surface of the mother board on the same side as the one side of the first semiconductor device;

and the solder bumps bonded to the second group of lands for external connection are arranged on the other side of the first semiconductor device on the upper surface of the mother board, and the solder bumps bonded to the first group of lands for external connection on the other side of the second semiconductor device are arranged on the lower surface of the mother board on the same side as the other side of the first semiconductor device.

The semiconductor module including the semiconductor device defined in the invention comprises a mother board of which on the upper and lower surfaces, lands are formed for mounting semiconductor device, and solder bumps are bonded to the lands.

In the semiconductor module according to the invention, the lands for external connection, dummy lands for external connection and the lands to which the solder bumps are bonded, respectively have equal diameters.

In the semiconductor module according to the invention, the solder bumps bonded to the first group of lands for external connection and dummy lands for external connection on same columns as them on the one side of a first semiconductor device are arranged on an upper surface of the mother board, and the solder bumps bonded to the second group of lands for external connection and dummy lands for external connection on the same columns as them on the one side of a second semiconductor device are arranged on the lower surface of the mother board on the same side as the one side of the first semiconductor device; and the solder bumps bonded to the second group of lands for external connection and dummy lands for external connection on the same column as them are arranged on the other side of the first semiconductor device on the upper surface of the mother board, and the solder bumps bonded to the first group of lands for external connection and dummy lands for external connection on the same columns as them on the other side of the second semiconductor device are arranged on the lower surface of the mother board on the same side as the other side of the first semiconductor device.

DETAILED DESCRIPTION OF THE PREFERRED EMBODIMENTS

Embodiment 1

Figure 1:
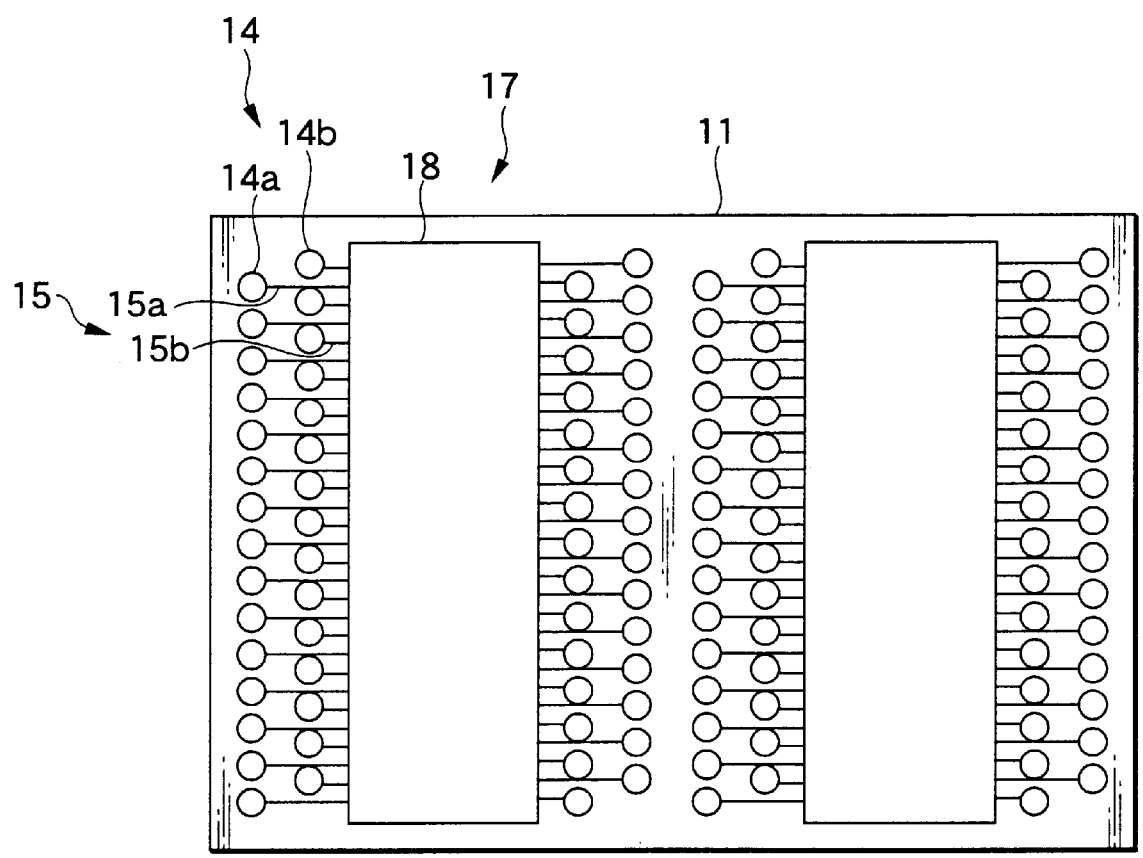
FIG. 1 is a plan view of a semiconductor device according to the first embodiment of the invention.
Figure 2:
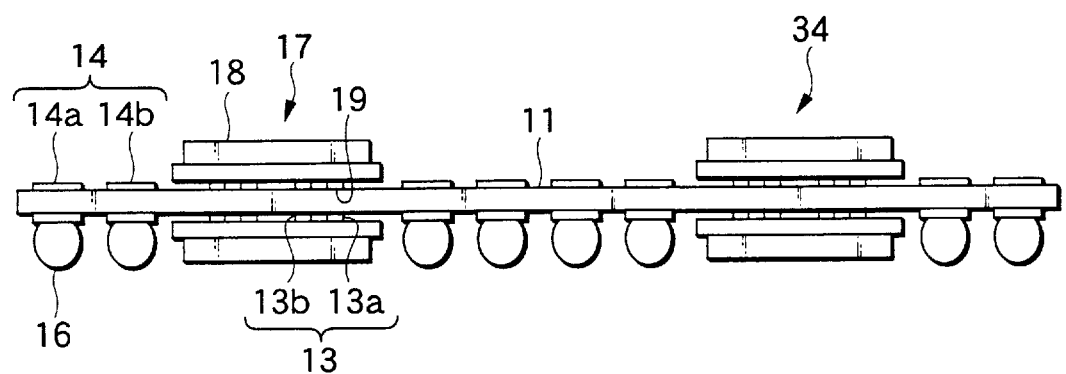
FIG. 2 is a side view of a semiconductor device of FIG. 1.
Figure 3:
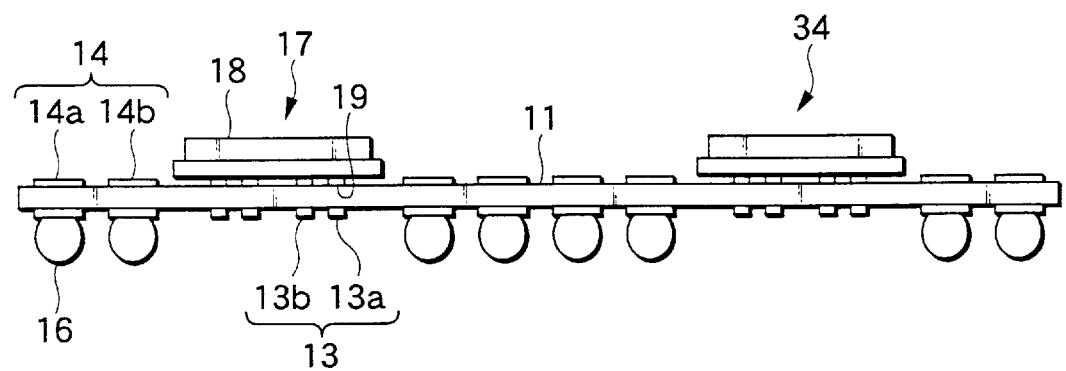
FIG. 3 is a side view of another semiconductor device in FIG. 1.
Figure 4:
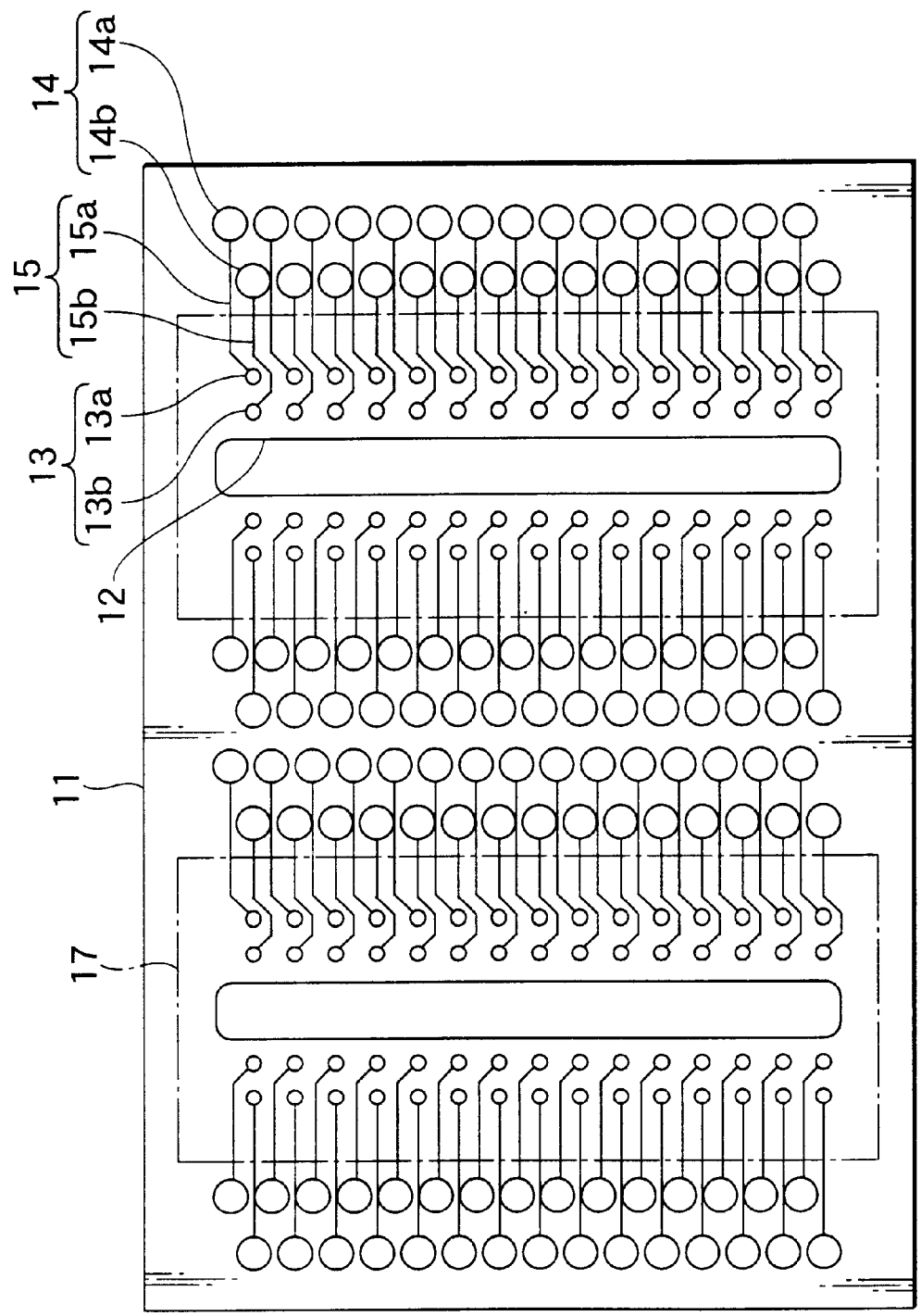
FIG. 4 is a plan view of the substrate in FIG. 1.
Figure 5:
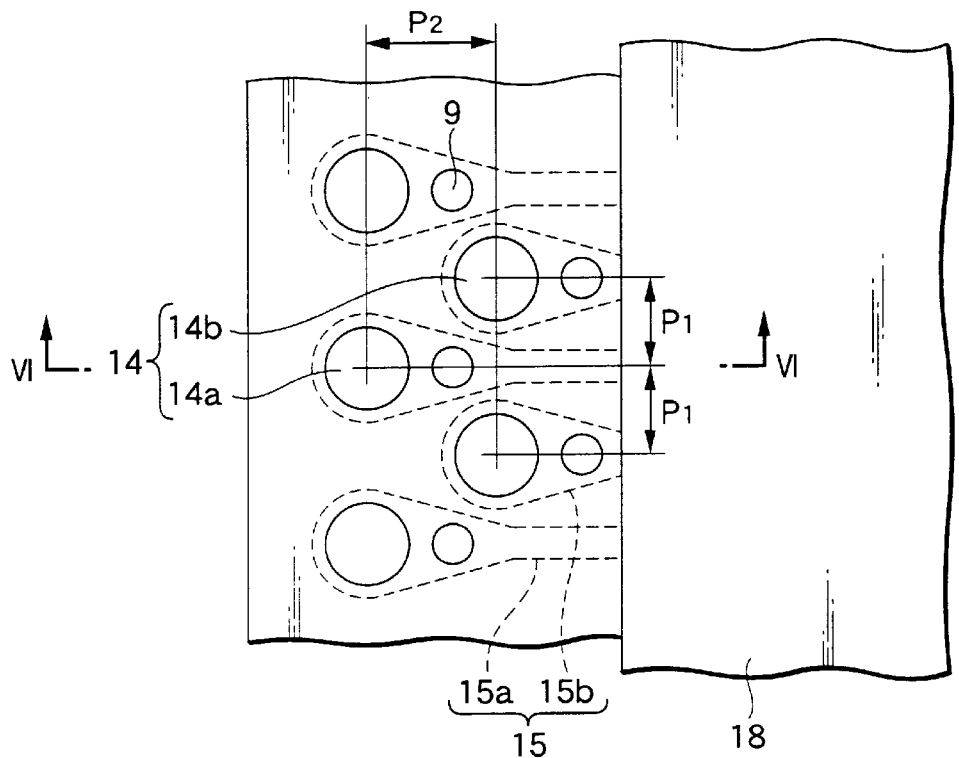
FIG. 5 is an enlarged plan view of the main part of FIG. 1.
Figure 6:
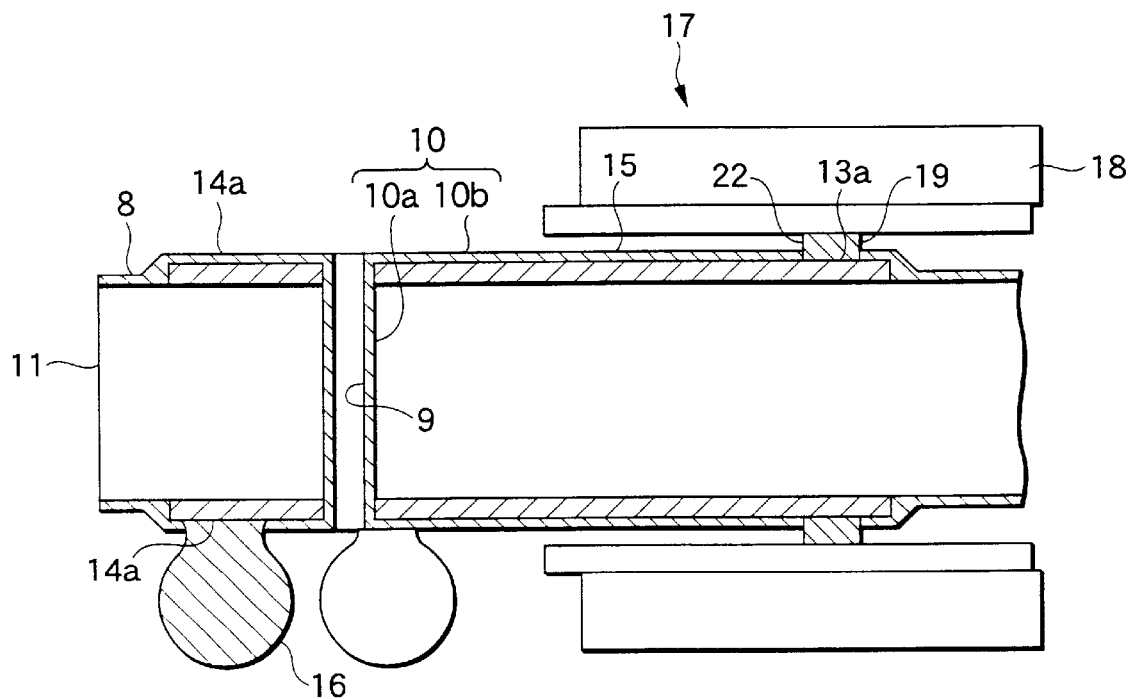
FIG. 6 is a sectional view taken in line VI—VI in FIG. 5.

Now referring to the drawings, an explanation will be given of the semiconductor device according to an embodiment of the invention. FIG. 1 is a plan view of the semiconductor device according to a first embodiment of the invention. FIG. 2 is a side view of the semiconductor device of FIG. 1. FIG. 3 is a side view-of another semiconductor device in FIG. 1. FIG. 4 is a plan view of a substrate in FIG. 1. FIG. 5 is an enlarged plan view of a main part of FIG. 1. FIG. 6 is a sectional view taken in line V1—V1 in FIG. 5. In these figures, like reference numerals refer to like elements in the prior art.

As apparent from FIGS. 1–6, an IC package 17 according to the first embodiment includes a plurality of external copper-foil electrodes 9 with their surface exposed onto the rear surface of a package body 18 containing a semiconductor chip with an integrated circuit (not shown) formed. For example, it may be an IC package having external electrodes 19 with the lands exposed on the rear surface of the package body 18 such as an "LGA (Land Grid Array) package" in which metallic balls are removed from an "BGA (Ball Grid Array) package" in which the metallic balls are arranged in a matrix shape on the rear surface of a package so that the lands to which metallic balls have been attached are exposed. In addition to the BGA and a CSP (Chip Scale Package), it may be an BOC (Board On Chip) disclosed in U.S. Pat. No. 5,384,689 or SON package (Small Outline Nonleaded Package) disclosed in the Unexamined Japanese Patent Application Publication No. Hei 10-335566. Namely, the IC package 17 includes the package body 18 and the external electrodes 19. In order to construct a low-profiled semiconductor device with its entire thickness reduced when it is mounted, the semiconductor device preferably has a possibly small thickness from the mounting surface of the external electrodes 19 to the upper surface of the package body 18, e.g. a BOC package.

In the semiconductor device 34 according to the first embodiment, as seen from FIG. 2, lands 13 (13a, 13b) for mounting to bond the IC package 17, lands 14 (14a, 14b) for external connection, and wirings 15 (15a, 15b) for electrically connecting the lands 13 for mounting and the lands 14 for external connection are attached to upper and lower surfaces of a substrate 11. The external electrodes 19 of an IC package 17 are bonded to the lands 13 for mounting. Solder bumps 16 are attached to the lands 14 for external connection on the one side of the substrate 11 (lower side in FIG. 2). Otherwise, as shown in FIG. 3, in the semiconductor device 34, the IC package 17 may be provided on only the one surface (upper surface in FIG. 3) of the substrate 11 as necessary.

The substrate 11 may be a plate made of glass epoxy. As seen from FIG. 4, the lands 13 for mounting (second group of lands 13a for mounting on the outside and first group of lands 13b for mounting on the inside) are arranged in four rows at a uniform pitch to correspond to the external electrodes 19 provided on the IC package 17. The lands 14 for external connection (second group of 14a for external connection on the outside and first group of lands 14b for external connection on the inside) are arranged at a uniform pitch in a staggered manner in two rows for each of the left and right sides of the IC package 17 to be mounted, and are parallel to the rows of the lands 13 for mounting. The wirings 15 (wirings 15a for connecting the lands 13a for mounting and lands 14a for external connection and wiring 15b for connecting the lands 13b for mounting and the lands 14b for external connection) are arranged in parallel at a uniform pitch and connect the lands 13 for mounting and the lands 14 for external connection electrically. More specifically, as shown in FIG. 5, the lands 14a and 14b for external connection are arranged in a staggered manner, are parallel, and have a pitch P2. The wirings 15a and 15b are arranged parallel to each other at a pitch P1 in a direction orthogonal to the direction of arrangement of the lands 14a and 14b. In this case, the pitch P2 is twice the pitch P1.

In FIG. 4, a through-hole 12 is opened in the substrate 11 so as to correspond to the central portion of the rear surface of the IC package 17 to be mounted. The through-hole 12 is selectively provided to dissipate the thermal distortion that is generated owing to a difference in the thermal expansion coefficients of the component members, and to receive the protrusion where the IC package 17 to be mounted protrudes according to its kind (for example, the wire bonding portion of the electrode on the surface at the center of the semiconductor chip and outer electrode 19 is subjected to resin potting using a BOC package so that it protrudes form the bonding face of the external electrode 19), thereby avoiding the contact with the upper surface of the substrate 11.

As seen from FIG. 5, in the configuration in which the lands 14a and 14b are arranged in a staggered manner with the pitch P2 twice as long as the pitch P1 of the wirings 15a and 15b, the pitch P2 is selected at a suitable value. Assuming that P2=P1, the distance between the centers of the lands 14a and 14b for external connection is 1.41×P1. Assuming that P2=1.73×P1, the distance is 2×P1. Now, it is assumed that the semiconductor device 34 is manufactured using a small-sized IC package 17 having the external electrodes exposed to the lower surface of the package body 18 in a manner of multiple pins and narrow pitches. In this case, by selecting a suitable value of P2, a small-sized semiconductor device can be acquired which can restrict an increase in the mounting area, can be easily manufactured to provide sufficient mechanical strength, can assure a predetermined gap between the adjacent solder bumps enough to assure the diameter of the solder bump 16, and gives no short-circuiting therebetween so that breakage or short-circuiting between the solder bumps 16 due to thermal fatigue or thermal deformation does not occur at the bonding portions of the solder bumps. In addition, since the diameter of the solder bump 16 can be set irrespectively of the lead pitch of the external electrodes, the semiconductor device can be standardized. Further, the breakage at the bonding portion of the solder bump 16 can be prevented so that addition of the step of bonding the package 18 and the mother board when the semiconductor module is structured can be avoided.

Referring to FIG. 6, an explanation will be given of the detailed structure of the main part of the semiconductor device 34. As seen from FIG. 6, on both upper and lower surfaces of the substrate 11, copper foils are patterned to form lands 14 (14a and 14b) for external connection and wirings 15 (15a and 15b). A through-hole 10a is made to penetrate through the substrate 11 and through-hole lands 10b which are oppositely formed on the upper and lower surfaces of the substrate 11. The wirings 15 (15a or 15b) on the upper and lower surfaces are electrically connected to each other through the conductive member 9 of e.g. Au, Ag, Co, Pd or solder formed by plating. Reference numeral 10 denotes an area where the through-hole including the through-hole 10a and the through-hole land 10b is formed. The external electrode 19 of the mounted IC package 17 and the land 13 for mounting are bonded to each other by the bonding material 22 of e.g. solder. The solder bump 16 is attached to the land 14a for external connection on the one side (lower side in FIG. 6) of the substrate 11. Solder resist 8 which is liquefied insulating resin is applied on the entire upper and lower surfaces of the substrate 11 except the areas where the through-hole 10a, land 13 for mounting and land 14 for external connection so that the surface of the substrate 11 is insulated.

The semiconductor device 34 can be manufactured as follows. First, bonding material 22 is applied to the lands 13 for mounting on the upper side of the substrate 11 through a solder printing mask (not shown). Next, the package body 18 is arranged on the opening 12 of the substrate 11 as necessary, and the external electrodes 19 of the IC package 17 are placed on the bonding material 22 so that they are positioned on the lands 13 for mounting the IC package, and the external electrodes 19 are soldered on the lands 13 for mounting by the technique of reflow. Thereafter, the substrate 11 is turned upside down. Likewise, the IC package 17 is soldered onto the lower side of the substrate 11, and the solder bumps 6 are soldered to the land 14a for external connection. Thus, the semiconductor device 24 is completed.

Incidentally, where the semiconductor device 34 is used in the other uses than the semiconductor module, the step of connecting the solder bumps 16 to the lands 14 for external connection is not required.

Embodiment 2

Figure 7:
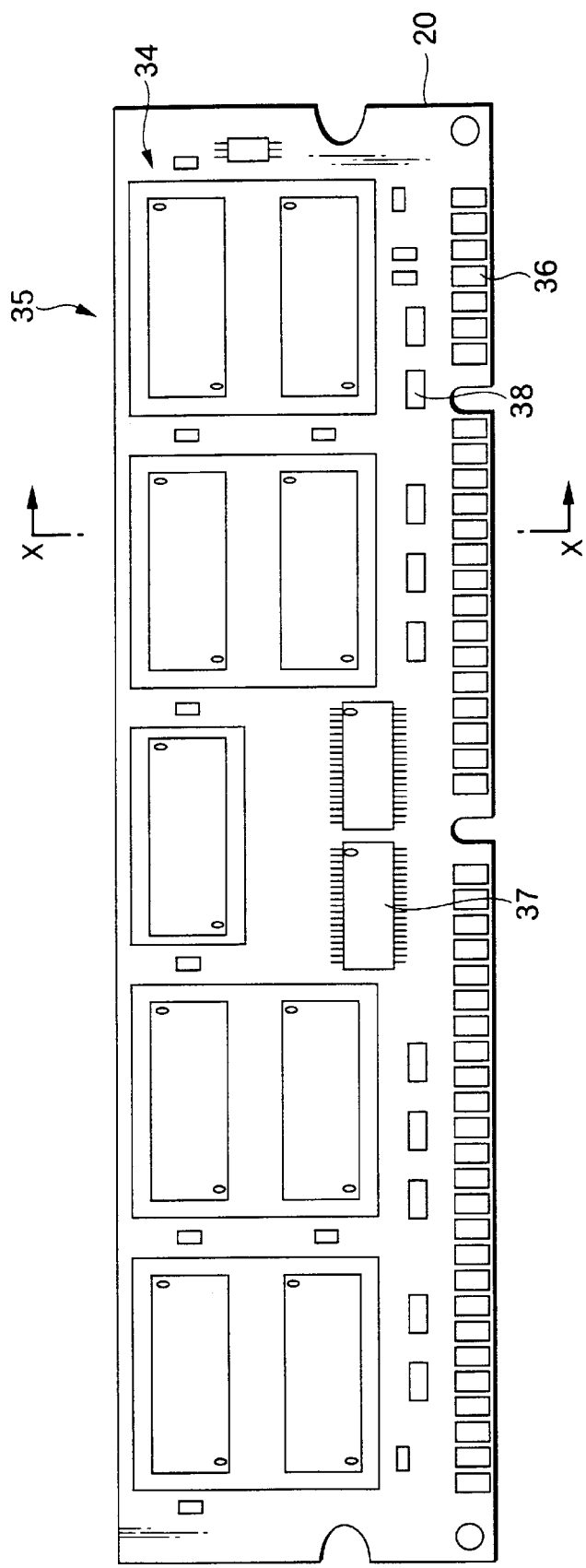
FIG. 7 is a plan view of a semiconductor module in which the semiconductor device shown in FIGS. 1 and 2 is attached to the mother board according to the second embodiment of the invention.
Figure 8:
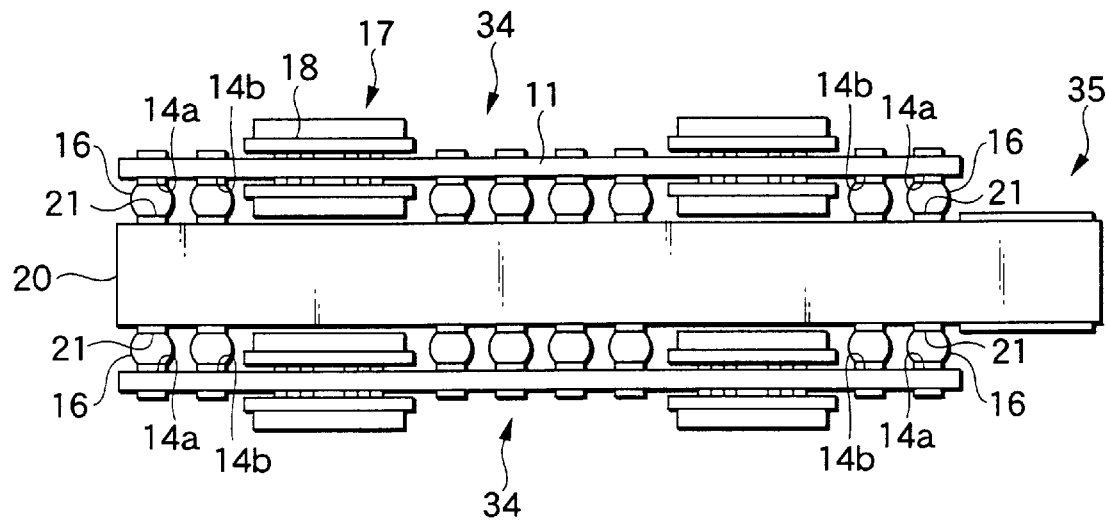
FIG. 8 is a side view of the semiconductor device in FIG. 7.
Figure 9:
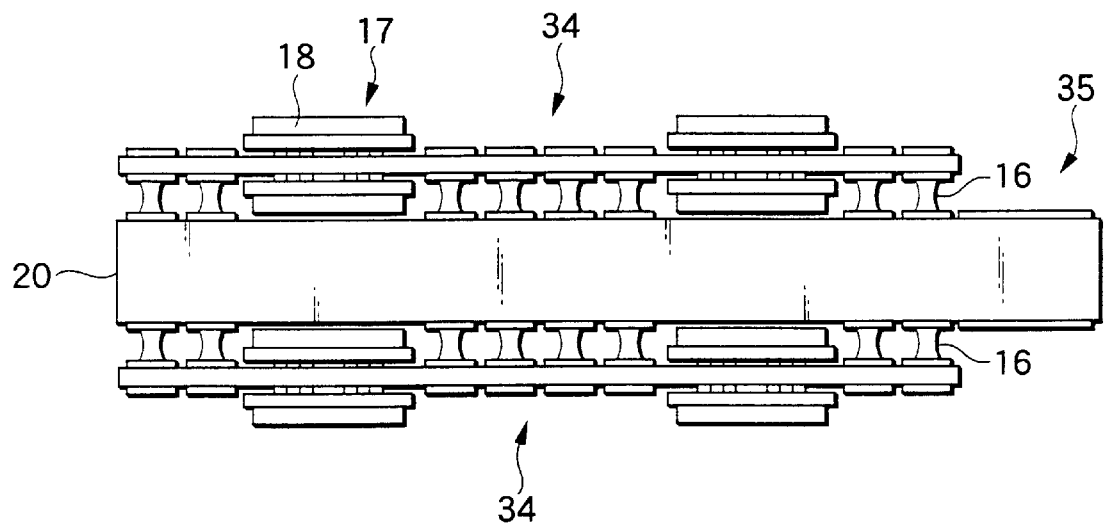
FIG. 9 is a side view of another semiconductor device in FIG. 7.

Referring to the drawings, an explanation will be given of the semiconductor module according to the second embodiment of the invention. FIG. 7 is a plan view of the semiconductor module in which the semiconductor device shown in FIGS. 1 and 2 are attached to a mother board. FIG. 8 is a side view of the semiconductor module shown in FIG. 7. FIG. 9 is a side view of the other semiconductor module in FIG. 7.

As seen from FIGS. 7 and 8, in the semiconductor module 35, lands 21 for connection are provided on the upper and lower surfaces of the mother board 20 so as to correspond to the lands 14 for external connection (14a, 14b) formed on the substrate 11 of the semiconductor device 34. The lands 21 are connected to the semiconductor device 34 through the solder bumps 16 and also mechanically secured to the mother board 20. The lands 21 are connected to external terminals 36 through wirings (not shown) formed on the upper and lower surfaces of the mother board 20. ICs 37 and passive elements 38 are also mounted on the upper and lower surfaces of the mother board 20.

Thus, the semiconductor module 35 is structured to include the semiconductor device 34, mother board 20, lands 21, external terminals 36, ICs 37 and passive elements 38.

The semiconductor module shown in FIG. 8 is characterized in that the lands 14 for external connection and lands 21 having the equal diameters to which the solder bumps 16 are bonded are connected to each other. The solder paste is supplied by the amount sufficient to provide the cylinder shape of the bonding portion with reference to the volume of the solder bump 16. In this way, the degree of thermal fatigue at the bonding area of the solder bump 16 can be made constant for the sectional area of the bonding portion so that the local weak portion of the bonding portion constituting the semiconductor module 35 can be excluded, thereby extending the life of the semiconductor module 35. Incidentally, the solder bump 16 may be formed in a shape of "tsuzumi" as in the other semiconductor module shown in FIG. 9. However, from the standpoint of improving the thermal fatigue, the solder bump 16 is formed more preferably in the shape of the cylinder than in a shape of the "tsuzumi".

The semiconductor module 35 can be manufactured as follows. First, the solder paste or flux is supplied by the amount of 1/6 of the volume of the solder bump 16 by means of the techniques of solder printing masking, dispenser and transfer. The solder bumps 16 of the semiconductor device 34 are placed on the positions supplied with the solder paste or flux, and the solder bumps 16 are soldered to the lands 21 by the technique of reflow. Thereafter, the mother board 20 is turned upside down. Likewise, the semiconductor device 34 is attached to the lower side of the mother board 20. Thus, the semiconductor module is completed. When the semiconductor module 35 thus completed is viewed perspectively in its planar arrangement, the first group of left and right lands 14b for external connection for the first semiconductor device 34 are OF bonded to the lower surface of the mother board 20. The first group of lands 14 for external connection are also bonded to the lower surface of the mother board 20 at the corresponding positions immediately below those on the upper surface. In this case, the lands 14 on the lower surface are arranged alternately with the corresponding lands 14 on the upper surface of the mother board 20 so that the former are not superposed on the latter in their planar arrangement. In the similar arrangement, the second groups of lands for external connection of the semiconductor device are also arranged on the upper and lower surface of the mother board 20.

This is because the lands 14a, 14b on the substrate 11 are arranged as shown in FIG. 1 and the semiconductor device 34 provided with such lands are mounted on the upper and lower surfaces of the mother board 20 to constitute the semiconductor module 35. In this way, all the lands 14a and 14b for external connection of the semiconductor device 34 mounted on the upper and lower surface of the mother board 20 are arranged in a laterally staggered manner so as not to be superposed in their plan on the upper side and lower side of the mother board 20. This decreases the equivalent vertical elastic coefficient of the semiconductor module 35 so that the stress at the bonding area of the solder bump 16 due to the thermal fatigue or thermal deformation can be decreased and the breakage can be effectively suppressed. Incidentally, the semiconductor device to be attached to the lower side is preferably supported during the reflow.

Embodiment 3

Figure 10:
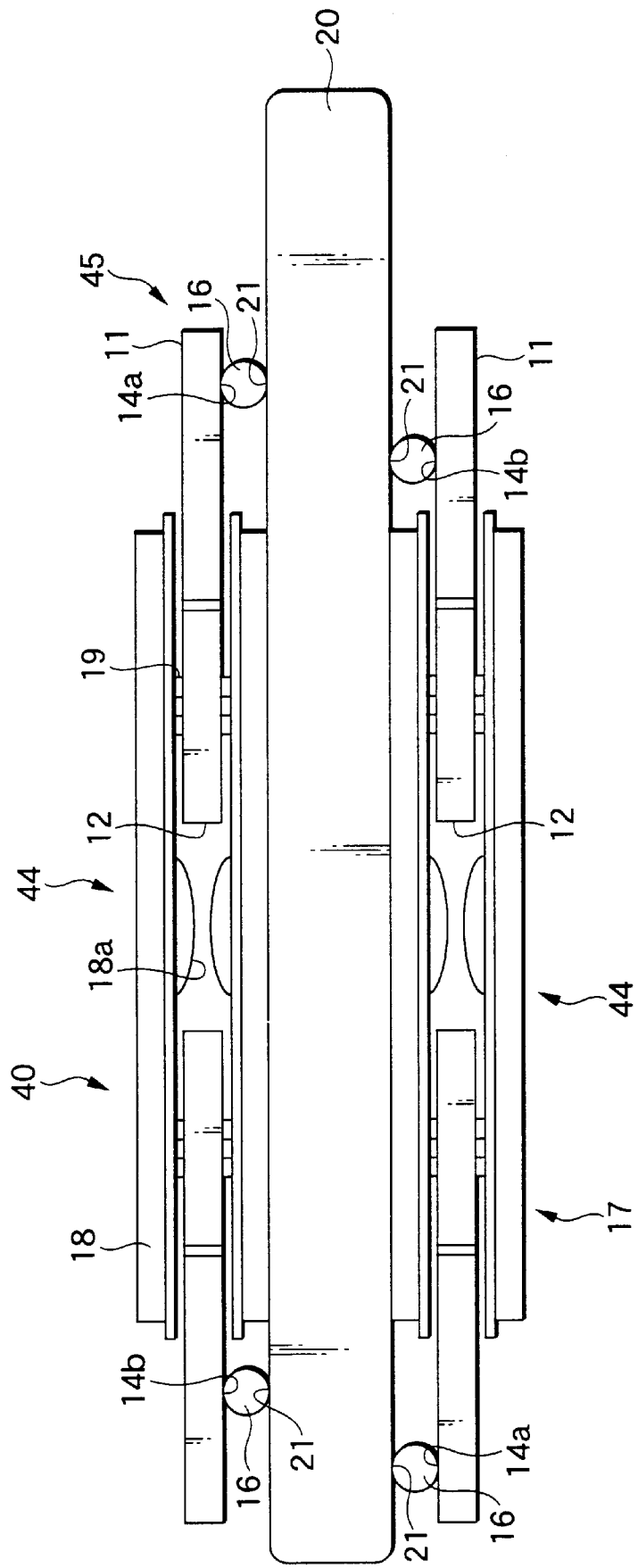
FIG. 10 is an enlarged sectional view taken in line X—X of the semiconductor module using a BOC package in FIG. 7 according to the third embodiment of the invention.
Figure 11:
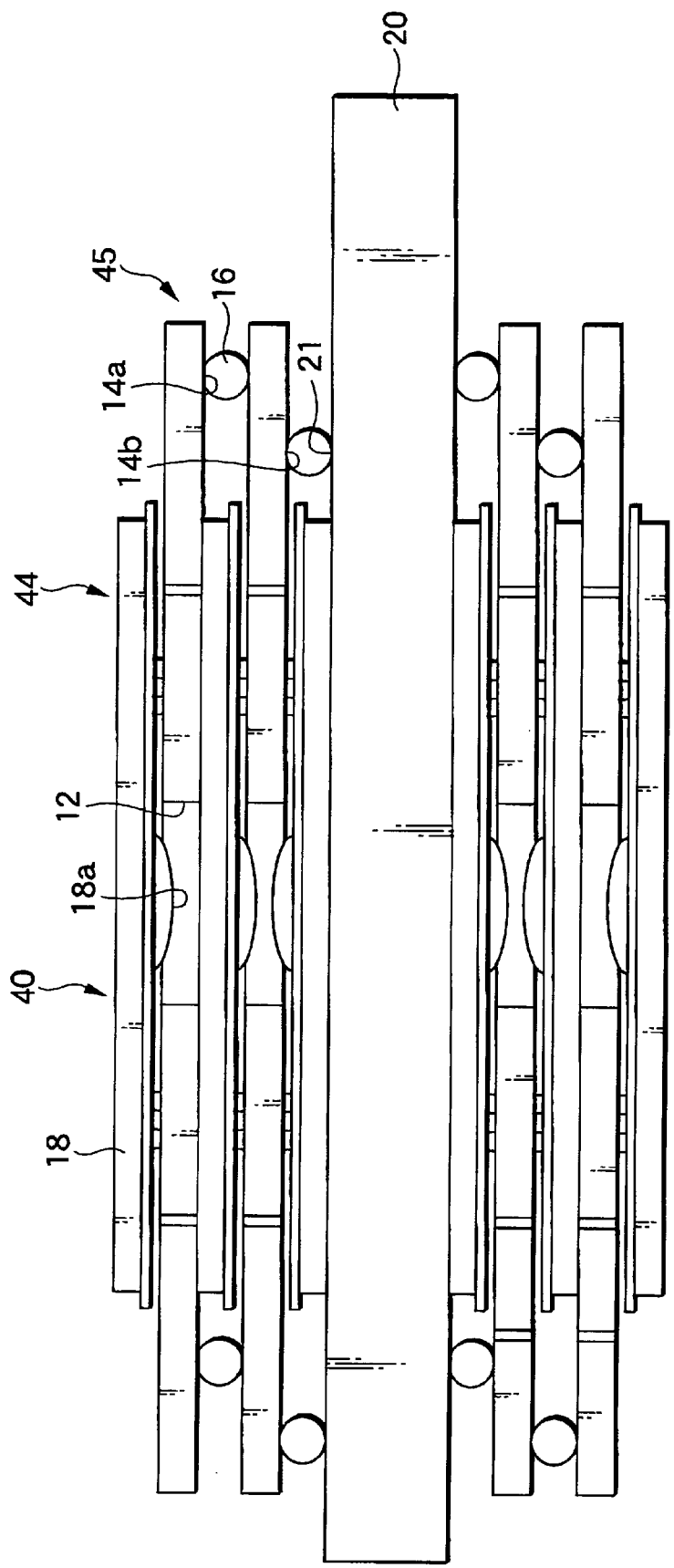
FIG. 11 is an enlarged sectional view taken in line X—X of the semiconductor module using a BOC package in FIG. 7.

Referring to the drawings, an explanation will be given of the semiconductor module according to the third embodiment of the invention. FIG. 10 is an enlarged sectional view taken in line X—X of the semiconductor module using a BOC package in FIG. 7. FIG. 11 is an enlarged sectional view taken in line X—X of another semiconductor module in FIG. 7.

The BOC package 40 is a package, as disclosed in e.g. U.S. Pat. No. 5,384,689, in which the electrodes (not shown) at the center on the surface of a semiconductor chip (not shown) and external electrodes 19 are connected by wire bonding and are subjected to resin potting. In the BOC package, a potting resin portion 18a protrudes from the bonding face of the external electrode 19. The semiconductor device 44 is structured in such a manner that the BOC package 40 is mounted on each of the upper and lower surfaces of the substrate 11 as in the first embodiment. In this case, the potting resin portion 18 is received in the through-hole 12 of the substrate 11 so that it is not brought into contact with the upper surface of the substrate 11.

The semiconductor module 45, a typical example of which is shown in FIG. 10, is structured so that the lands 14a and 14b provided on the substrate 11 of the semiconductor device 44 are connected to the lands 21 formed on the upper and lower surfaces of the mother board 20 through the solder bumps 16. In this case, with respect to the positions where they are connected to the lands 21 of the mother board 20, the lands 14a and 14b for external connection on the upper side of FIG. 10 are laterally displaced from the lands 14a and 14b for external connection on the lower side of FIG. 10.

In the semiconductor module 45 thus structured, when the semiconductor device 44 are secured to the mother board 20 by the technique of reflow, the first group of lands 14b for external connection for the one side (left side of FIG. 10) of the semiconductor device 44 are bonded onto the upper surface of the mother board 20, whereas the second group of lands 14a for external connection for the same one side are bonded onto the lower surface of the semiconductor device 44. Likewise, on the other side (right side of FIG. 10) of the semiconductor device, the lands 14a and 14b for external connection are arranged and bonded on both upper and lower surfaces of the mother board in the laterally staggered manner. In this way, all the lands 14a and 14b for external connection of the semiconductor device 34 mounted on the upper and lower surface of the mother board 20 are arranged in a laterally displaced manner so as not to be superposed in their plan on the upper side and lower side of the mother board 20. This decreases the equivalent vertical elastic coefficient of the semiconductor module 35 so that the stress at the bonding area of the solder bump 16 due to the thermal fatigue or thermal deformation can be decreased and the breakage can be effectively suppressed.

In the configuration shown in FIG. 11, the semiconductor device 44 are stacked in two stages on the upper side and lower side of the mother board 20. In this case also, the lands 14a and 14b for external connection are staggered laterally. This configuration provides the same effect as that in FIG. 10. Further, the semiconductor device 44 may be mounted on only the upper surface of the mother board 20 as necessary. In this case, the number of manufacturing steps can be reduced by the step of mounting the semiconductor device 44 on the lower side of the mother board 20, thereby providing a more inexpensive semiconductor module.

Embodiment 4

Figure 12:
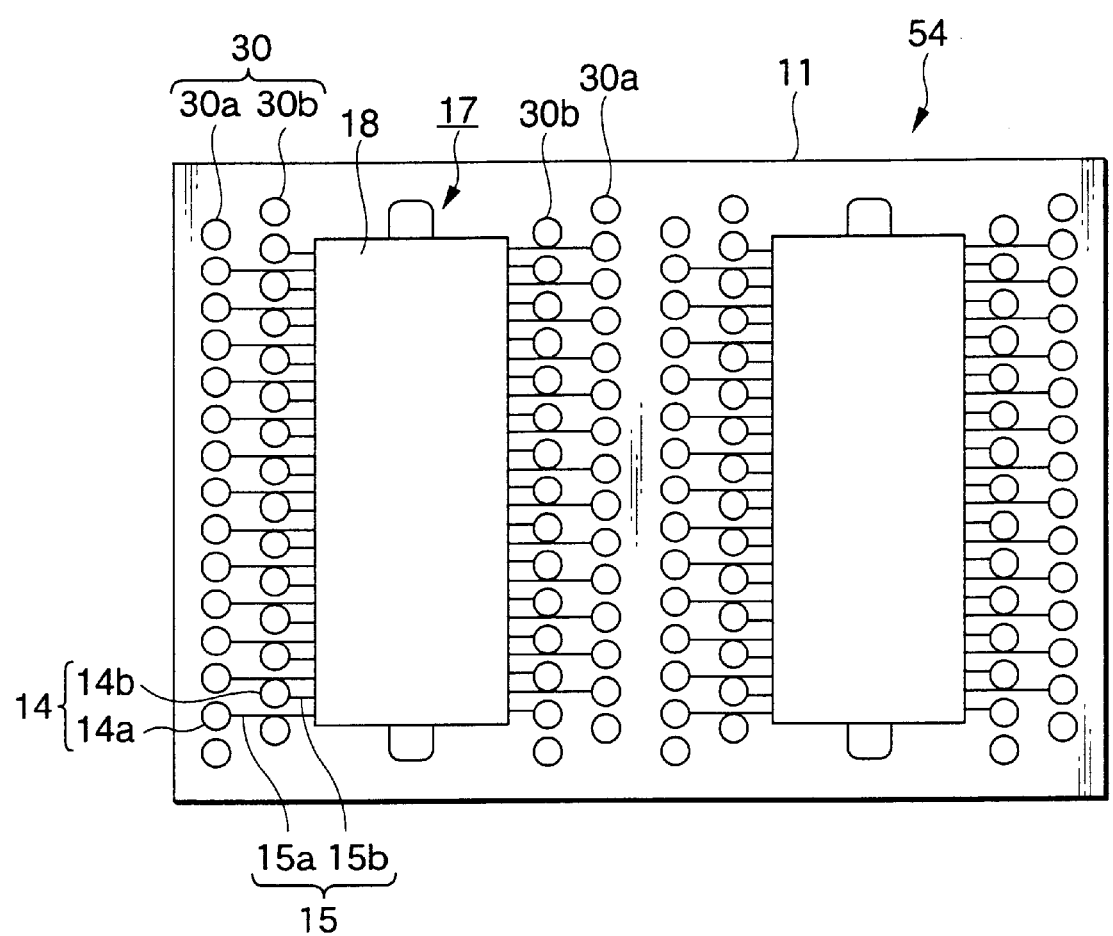
FIG. 12 is a plan view of the semiconductor device according to the fourth embodiment of the invention.
Figure 13:
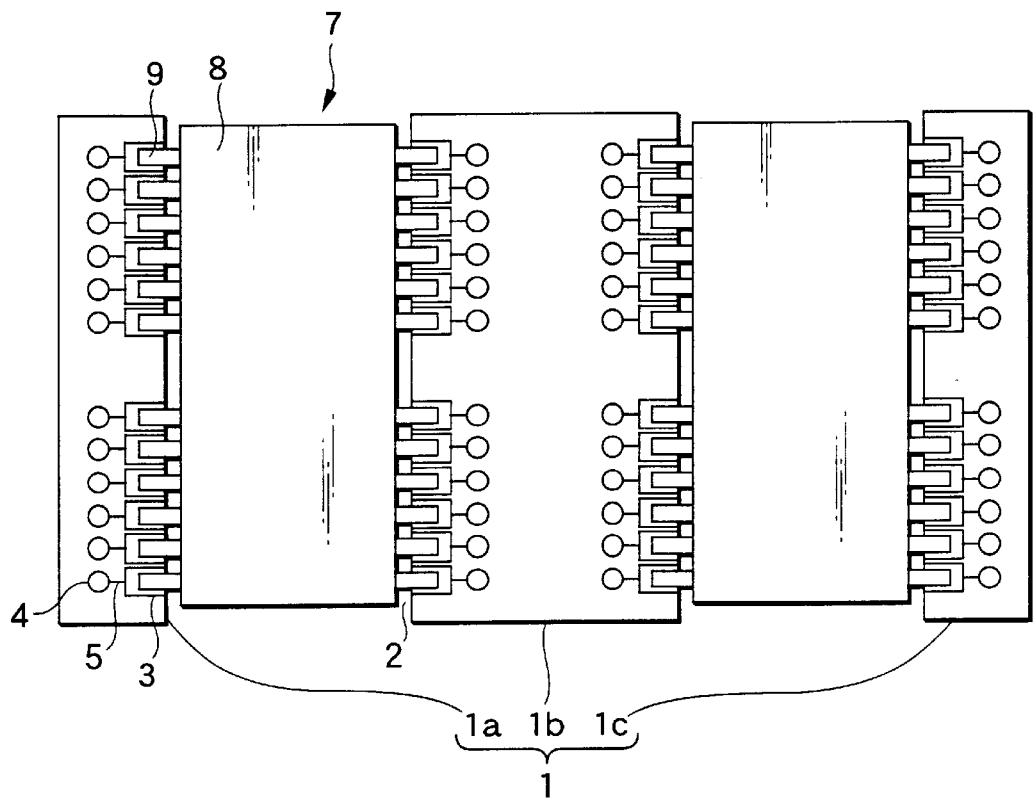
FIG. 13 is a plan view of a conventional semiconductor device.
Figure 14:
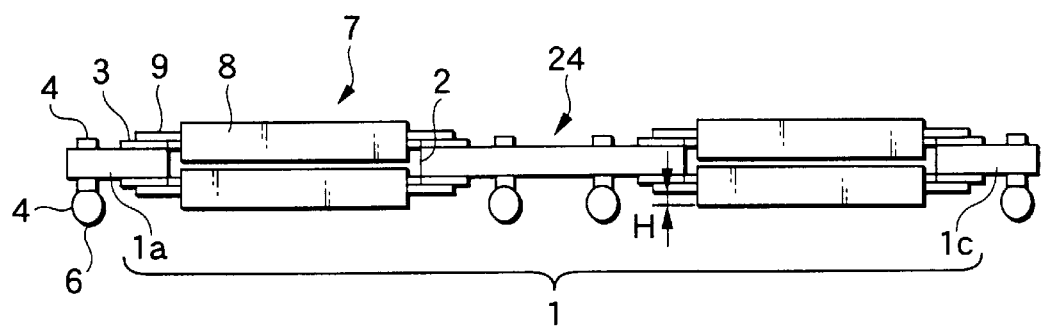
FIG. 14 is a side view of FIG. 13.
Figure 15:
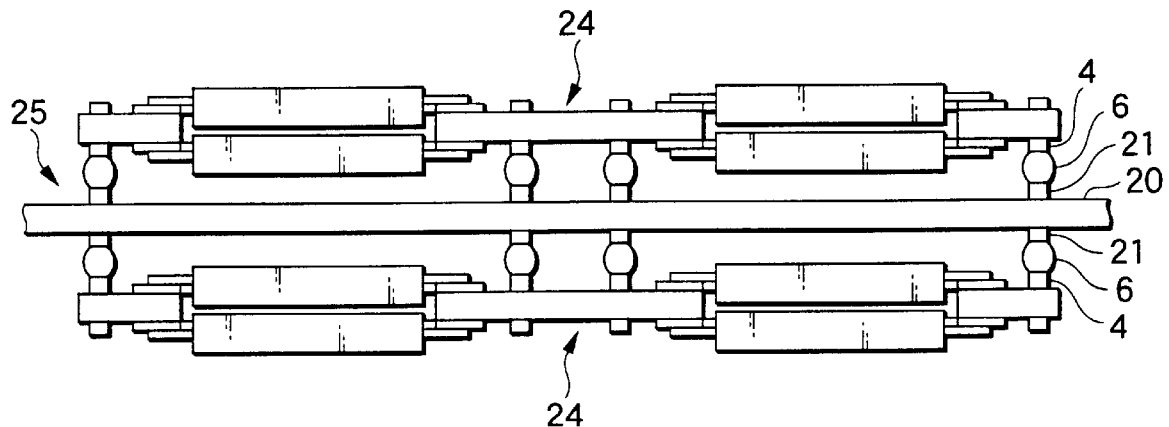
FIG. 15 is a side view of a conventional semiconductor module in which the semiconductor device shown in FIGS. 13 and 14 is attached to a mother board.
Figure 16:
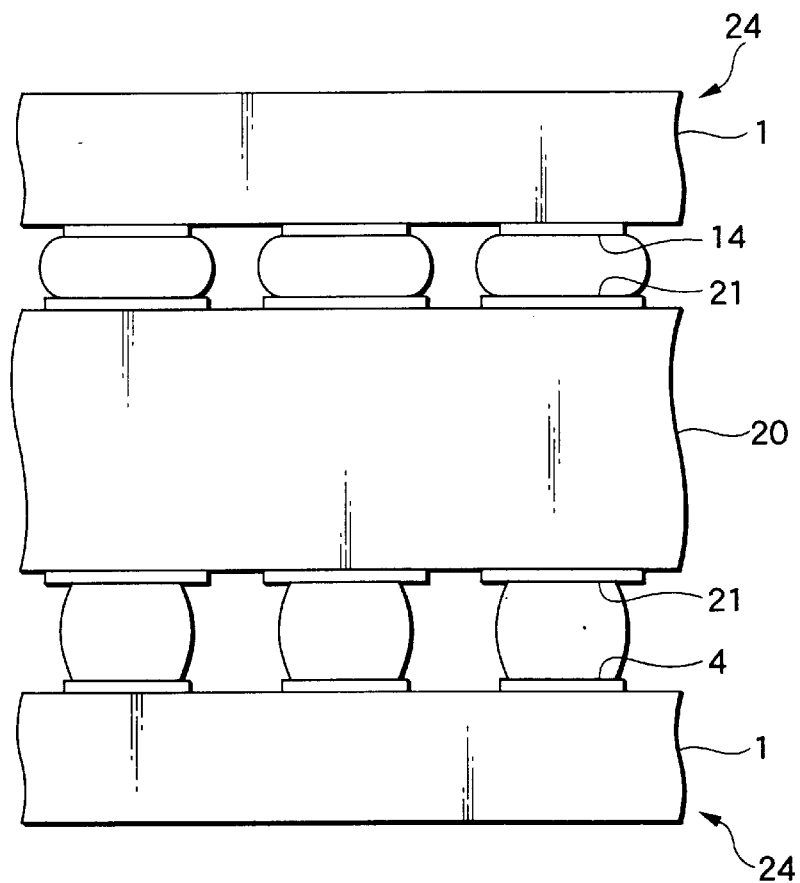
FIG. 16 is a side view of a conventional semiconductor module schematically showing the deformed solder bumps on the upper and lower sides of the conventional semiconductor module.

FIG. 12 is a plan view of the semiconductor device according to the fourth embodiment of the invention. The side view of FIG. 12 is the same as FIG. 2. As seen from FIG. 12, as in the first embodiment, in the semiconductor device 54, the first group of lands 14b and the second group of lands 14a for external connection are arranged in the staggered manner on the upper and lower surfaces of the substrate 11. In addition, this configuration is characterized in that dummy lands 30a and 30b for external connection are arranged on the extending lines of both ends of each of the arrangements of lands 14a and 14b.

When the semiconductor module is structured using the semiconductor 54 having such a configuration, the breakage at the bonding area can be effectively prevented. Namely, in the first embodiment, the greatest thermal deformation force occurs at the solder bonding portions of both ends between which the distance is the longest when the semiconductor device 54 is secured to the mother board 20 by the solder bumps 16. On the other hand, in this embodiment, since the dummy lands 30a and 30b for external connection are arranged at both ends between which the distance is the longest when the semiconductor device 54 is secured to the mother board 20 by the solder bumps 16, the dummy lands for 30a and 30b for external connection bear the greatest thermal deformation force. This effectively prevents the breakage of the solder bonding portion at the lands 14a, 14b for external connection at both ends.

In the semiconductor module (not shown) using the semiconductor device 54, as in the second embodiment, the solder bumps 21, which are bonded to the lands 14a, 14b and dummy lands 30a, 30b for external connection, are bonded to the lands 21 of the mother board 21 so that the semiconductor device 54 is electrically connected and mechanically secured to the mother board 20. In this case, the diameters of the lands 14a, 14b and dummy lands 30a, 30b for external connection are made equal to provide equal areas. This removes the local weak portion of the bonding portion in the semiconductor module 35, thereby extending the life of thermal fatigue.

In the semiconductor module using the semiconductor device 54, the solder bumps 16, which are bonded to the lands 14a, 14b for external connection and dummy lands 30a, 30b for external connection, are bonded to the lands of the mother board 20. In this case, as in the third embodiment, with respect to the positions where they are connected to the lands 21 of the mother board 20, the lands 14a, 14b and dummy lands 30a, 30b for external connection on the upper side may be laterally displaced from the lands 14a, 14b and dummy lands 30a, 30b for external connection on the lower side. This provides the same effect as in the third embodiment.

Further, the equal diameters may be given to the lands 14a, 14b and 30a, 30b for external connection and lands 21. This provides the same effect as in the third embodiment.

In the configuration described above, the invention can provide the following effects.

In the invention, the semiconductor device is structured in such a manner that a substrate is provided with lands for mounting to which the external electrodes are bonded, lands for external connection connected to solder bumps for external connection and formed outside an area where an IC package is mounted, and wirings for connecting the lands for mounting and the lands for external connection; and the external electrodes of the IC package having a plurality of external electrodes exposed to the rear surface of a package body are bonded to the lands for mounting. The semiconductor module is structured by mounting the semiconductor module. Such configurations provide a low-profiled semiconductor device and semiconductor module. In the above semiconductor device, the IC package is a BOC package, and the substrate includes a through-hole for receiving potting resin, the potting resin sealing a wire bonding portion of the BOC package to protrude when the BOC package is mounted on the substrate. This configuration provide a more low-profiled semiconductor device and semiconductor module.

In the above semiconductor device, the lands for external connection includes a first group of lands for external connection which are arranged with pitches twice as long as those of the wirings on both sides of the package body; and a second group of lands for external connection which are arranged with pitches twice as long as those of the wirings outside the first group of lands for external connection, the second group of lands for external connection being arranged in a staggered manner from the first group of lands for external connection in their column directions. In such a configuration, the diameter of the solder bumps for external connection and distance therebetween can be suitably selected irrespectively of the pitch of the external electrodes of the IC package. Therefore, a semiconductor device and a semiconductor module can be provided which are free from the short-circuiting between the solder bumps and from the breakage due to the thermal fatigue or thermal deformation at the soldering portion of each of the solder bumps and having a small mounting area.

In the semiconductor device, dummy lands for external connection which are not connected to the external electrodes of the IC package are formed outside the ends of columns of the first group of lands for external connection and second group of lands for external connection which are formed on the upper and lower surface of the substrate, and the solder bumps are bonded to the dummy lands for external connection which are formed on the same plane as that of the lands for external connection to which the solder bumps are bonded. In this configuration, a semiconductor device and a semiconductor module can be provided which prevent the breakage at the soldering portions of the lands at both ends of columns of the lands for external connection. In the semiconductor module, the lands for external connection, dummy lands for external connection and the lands to which the solder bumps are bonded, respectively have equal diameters. In this configuration, the local weak portions at the bonding portions can be removed to extend the thermal fatigue life.

In the semiconductor device, the arrangement of lands are displaced in the direction of their columns of the first group and the second group of lands for external connection and dummy lands for external connection. Such semiconductor device are mounted on the upper and lower surface of the mother board. The columns of these lands external connection on the upper surface of the mother board are laterally displaced from the columns of these lands for external connection on the lower side of the mother board. This configuration provides a semiconductor module which decreases the equivalent vertical elastic coefficient of the semiconductor module so that the stress at the bonding area of the solder bump due to the thermal fatigue or thermal deformation can be decreased and the breakage can be effectively suppressed.

What is claimed is:

1. A semiconductor device comprising:
    an IC package having a body with a rear surface over which a plurality of external electrodes are distributed and exposed; and
    a substrate having first and second surfaces, said IC package being mounted with the first surface of said substrate and the rear surface of said IC package in face-to-face relationship, said substrate including
       respective lands for mounting to which said external electrodes are correspondingly bonded, said lands for mounting being disposed between the first surface of said substrate and the rear surface of said IC package,
       lands for external connection disposed on the first surface of said substrate beyond said IC package and including first solder bumps for external connection, and
    wirings connecting respective lands for mounting to corresponding lands for external connection, wherein said wirings are arranged at a first pitch on opposite sides of said package body, and said lands for external connection include
       a first group of lands for external connection arranged at a pitch twice as large as the pitch of said wirings, and
       a second group of lands for external connection arranged at a pitch twice as large as the pitch of said wiring and located farther from said package body than said first group of lands for external connection, said second group of lands for external connection being staggered with respect to said first group of lands for external connection.

2. The semiconductor device according to claim 1, including dummy lands for external connection which are not connected to said external electrodes and are located outside columns of said first group of lands for external connection and said second group of lands for external connection on the first and second surfaces of said substrate, and including second solder bumps bonded to said dummy lands for external connection that are coplanar with said lands for external connection to which said first solder bumps are bonded.

3. A semiconductor module comprising:
    a first semiconductor device as defined in claim 2, and a second semiconductor device as defined in claim 2; and
    a mother board including upper and lower surfaces, each of the upper and lower surfaces having lands for mounting semiconductor devices, said first semiconductor device being mounted on said lands for mounting semiconductor devices on the upper surface of said mother board, said second semiconductor device being mounted of said lands for mounting semiconductor devices on the lower surface of said mother board, and second solder bumps bonded to said lands for mounting semiconductor devices, thereby mounting said first and second semiconductor devices to said mother board.

4. The semiconductor module according to claim 3, wherein said lands for external connection, said dummy lands for external connection, and said lands for mounting semiconductor devices, to which said second solder bumps are bonded, have respective diameters that are equal.

5. The semiconductor module according to claim 3, wherein
    said first solder bumps bonded to said first group of lands for external connection and said dummy lands for external connection are located at the upper surface of said mother board, and
    said first solder bumps bonded to said second group of lands for external connection and dummy lands for external connection are located at.the lower surface of said mother board, and
    said first solder bumps bonded to said second group of lands for external connection and dummy lands for external connection are located at the upper surface of said mother board, and
    said first solder bumps bonded to said first group of said lands for external connection and dummy lands for external connection are located at the lower surface of said mother board.

6. A semiconductor module comprising:
    first and second semiconductor devices, each of said first and second semiconductor devices including
       an IC package having a body with a rear surface over which a plurality of external electrodes are distributed and exposed, and
       a substrate having first and second surfaces, said IC package being mounted with the first surface of said substrate and the rear surface of said IC package in face-to-face relationship, said substrate including
          respective lands for mounting to which said external electrodes are correspondingly bonded, said lands for mounting being disposed between the first surface of said substrate and the rear surface of said IC package, lands for external connection disposed on the first surface of said substrate beyond said IC package and including first solder bumps for external connection, and wirings connecting respective lands for mounting to corresponding lands for external connection: and a mother board including upper and lower surfaces, each of the upper and lower surfaces having lands for mounting semiconductor devices, said first semiconductor device being mounted on said lands for mounting semiconductor devices on the upper surface of said mother board, said second semiconductor device being mounted of said lands for mounting semiconductor devices on the lower surface of said mother board, and second solder bumps bonded to said lands for mounting semiconductor devices, thereby mounting said first and second semiconductor devices to said mother board, wherein said lands for external connection and said lands for mounting semiconductor devices to which said second solder bumps are bonded have respective diameters that are equal, said lands for external connection of each of said first and second semiconductor devices include a first group of lands for external connection arranged at a pitch twice as large as the pitch of said wirings, and a second group of lands for external connection arranged at a pitch twice as large as the pitch of said wiring and located farther from said package body than said first group of lands for external connection, said second group of lands for external connection being staggered with respect to said first group of lands for external connection, said first solder bumps bonded to said first group of lands for external connection of said first semiconductor device are located at the upper surface of said mother board, and said first solder bumps bonded to said second group of lands for external connection of said second semiconductor device are located at the lower surface of said mother board.

* * * * *